United States Patent
Hsu et al.

(10) Patent No.: US 7,346,083 B2
(45) Date of Patent: Mar. 18, 2008

(54) BANDWIDTH ENHANCED SELF-INJECTION LOCKED DFB LASER WITH NARROW LINEWIDTH

(75) Inventors: Tsung-Yuan Hsu, Westlake Village, CA (US); Willie Ng, Agoura Hills, CA (US); Daniel Yap, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1301 days.

(21) Appl. No.: 09/829,781

(22) Filed: Apr. 10, 2001

(65) Prior Publication Data

US 2002/0163941 A1    Nov. 7, 2002

(51) Int. Cl.
*H01S 3/10* (2006.01)
(52) U.S. Cl. .................................. 372/20; 372/18
(58) Field of Classification Search ............... 372/20, 372/26, 37, 6, 94; 359/245
See application file for complete search history.

(56) References Cited

U.S. PATENT DOCUMENTS

| | | | | |
|---|---|---|---|---|
| 4,768,852 A * | 9/1988 | Ih ........................... 359/287 |
| 4,769,853 A * | 9/1988 | Goodwin et al. ........... 398/188 |
| 5,027,360 A * | 6/1991 | Nabors et al. ............... 372/18 |
| 5,084,779 A * | 1/1992 | Stanley ...................... 359/152 |
| 5,200,964 A * | 4/1993 | Huber ......................... 372/26 |
| 5,208,819 A * | 5/1993 | Huber ......................... 372/32 |
| 5,295,209 A * | 3/1994 | Huber ......................... 385/37 |
| 5,379,309 A * | 1/1995 | Logan, Jr. .................. 372/18 |
| 5,561,546 A * | 10/1996 | Esman ....................... 359/245 |
| 5,659,560 A * | 8/1997 | Ouchi et al. ................ 372/27 |
| 5,717,708 A * | 2/1998 | Mells ......................... 372/32 |
| 5,723,856 A * | 3/1998 | Yao ........................ 250/227.11 |
| 5,777,778 A * | 7/1998 | Yao ............................ 359/245 |
| 5,781,327 A * | 7/1998 | Brock et al. ................ 359/249 |
| 5,818,587 A * | 10/1998 | Devaraj et al. ............. 356/477 |
| 5,917,179 A * | 6/1999 | Yao ....................... 250/227.11 |
| 5,923,687 A | 7/1999 | Simpson et al. ............. 372/18 |
| 5,929,430 A * | 7/1999 | Yao ............................ 250/205 |
| 6,014,390 A | 1/2000 | Joyner ........................ 372/20 |
| 6,034,976 A * | 3/2000 | Mossberg et al. ............ 372/32 |
| 6,178,036 B1 * | 1/2001 | Yao ............................ 359/334 |
| 6,233,080 B1 * | 5/2001 | Brenner et al. ............. 398/196 |
| 6,404,590 B1 * | 6/2002 | Kuo et al. ................... 360/135 |
| 6,639,946 B2 * | 10/2003 | Wu et al. .................... 375/247 |
| 6,661,976 B1 * | 12/2003 | Gnauck et al. ............. 398/183 |

(Continued)

OTHER PUBLICATIONS

Meng, X.J., "Improved Intrinsic Dynamic Distortions in Directly Modulated Semiconductor Lasers by Optical Injection Locking," *IEEE Transactions on Microwave Theory & Techniques*, vol. 47, No. 7, pp. 1172-1176 (1999).

(Continued)

*Primary Examiner*—Dung T Nguyen
(74) *Attorney, Agent, or Firm*—Ladas & Parry

(57) ABSTRACT

A laser system and method for self-injection locking. The system includes a laser having a laser output at a frequency $\omega_o$. An optical port provides a portion of the laser output at the port and a modulator, coupled to the port, is driven by a RF signal at a frequency $\omega_m$ generates two sidebands at $\omega_o \pm \omega_m$. A filter passes one of the two sidebands; and an optical path couples an output of the filter to the laser for injection locking.

34 Claims, 1 Drawing Sheet

U.S. PATENT DOCUMENTS

2005/0169641 A1* 8/2005 Ogusu .................. 398/183

OTHER PUBLICATIONS

Meng, X.J., et al., "Improved Intrinsic Dynamic Distortions in Directly Modulated Semiconductor Lasers by Optical Injection Locking," *IEEE Transactions on Microwave Theory and Techniques*, vol. 47, No. 7, pp. 1172-1176 (Jul. 1999).

Pfeiffer, T., et al., "40 GHz Pulse Generation Using a Widely Tunable All-Polarisation Preserving Eribium Fibre Ring Laser," *Electronics Letters*, vol. 29, No. 21, pp. 1849-1850 (Oct. 14, 1993).

Schmuck, H., et al., "Widely Tunable Narrow Linewidth Eribium Doped Fibre Ring Laser," *Electronics Letters*, vol. 27, No. 23, pp. 2117-2119 (Nov. 7, 1991).

Simpson, T.B., et al., "Bandwidth Enhancement and Broadband Noise Reduction in Injection-Locked Semiconductor Lasers," *IEEE Photonics Technology Letters*, vol. 7, No. 7, pp. 709-711 (Jul. 1995).

Sousa, J.M., et al., "Short Pulse Generation and Control in Er-doped Frequency-shifted-feedback Fibre Lasers," *Optical Communications*, vol. 183, No. 1-4, pp. 227-241 (Sep. 1, 2000).

Wey, J.S., et al., "Performance Characterization of Harmonically Mode-Locked Erbium Fiber Ring Laser," *IEEE Photonics Technology Letters*, vol. 7, No. 2, pp. 152-154 (Feb. 1995).

Yamashita, S., et al., "High-performance Single-frequency Fibre Fabry-Perot Laser (FFPL) with Self-injection Locking," *Electronics Letters*, vol. 35, No. 22 (Oct. 28, 1999).

* cited by examiner

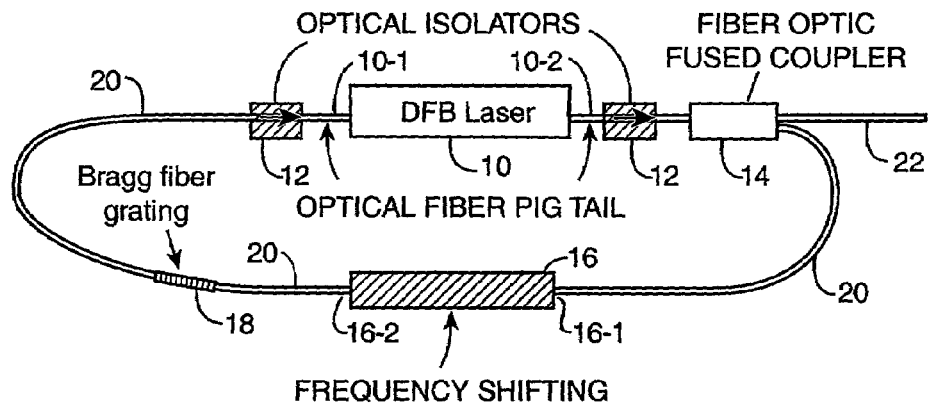
FIG. 1
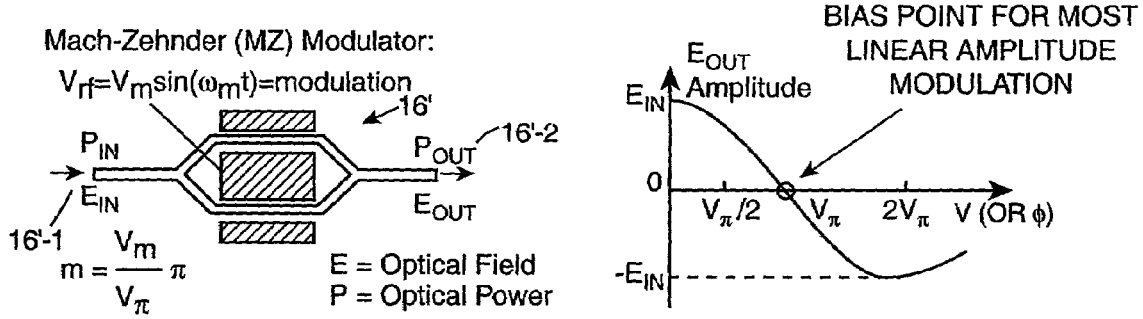
FIG. 2
FIG. 3
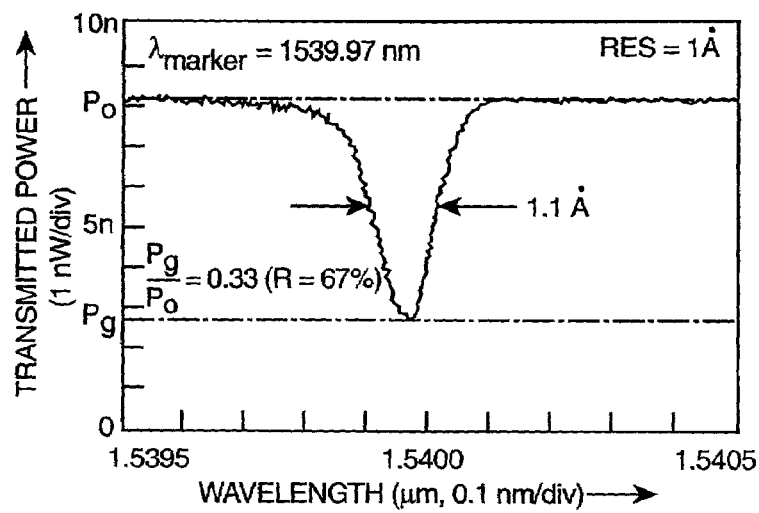
FIG. 4

BANDWIDTH ENHANCED SELF-INJECTION LOCKED DFB LASER WITH NARROW LINEWIDTH

TECHNICAL FIELD

This invention relates to a self-injection locking technique for enhancing the modulation bandwidth of a distributed feedback (DFB) semiconductor laser. It will reduce simultaneously its harmonic distortion and linewidth.

BACKGROUND AND ADVANTAGES OF THE INVENTION

Photonic beamforming techniques can be used for the optical control of phased arrays, for example in a space-based radar. A compact, directly modulated photonic transmitter that would exhibit large modulation bandwidths and low harmonic distortions is highly desirable in such an application.

Distributed feedback (DFB) lasers are key components for telecommunication networks and fiber based RF photonic systems. However, the bandwidth of commercial available DFB lasers is typically well below 10 GHz which will not be able to meet the needs of most near-future application. One way of improving the bandwidth to well beyond 10 GHz is to use external optical injection technique as theoretically predicted by J. Wang and G. Ybre and as experimentally demonstrated by X. J. Meng. Meng has reported the enhancement of bandwidth by a factor of 3.7 and reduction of second harmonic distortion by 10 dB. They also observed the narrowing of line-width in their experiments as well as the reduction of distortion products. See X. J. Meng, *IEEE Trans. Microwave Theory & Technique*, vol. 47, no. 7, pp 1172-1176 (1999).

However, the prior art technique requires the use of an external laser (e.g. a Ti-Sapphire laser) tuned to within 5-25 GHz of the slave DFB laser, to realize performance gains, which laser is bulky and adds expense. Furthermore, the use of two physically distinct lasers (as the master laser and slave laser) make their optimal conditions for injection locking highly vulnerable to environmental perturbations such as temperature variations.

The self-injection locking technique of the present invention offers the advantages of low cost and compactness combined with ruggedization in packaging. Most importantly, it offers thermal stability over the external injection technique reported by X. J. Meng et al. In particular, a self-injection locked DFB laser should achieve much improved performance stability with respect to environmental perturbations. According to the two-laser prior art technique, for an injection ratio of −15 dB, a differential frequency stability of ~15 GHz between the master and slave laser must be maintained. This translates into a wavelength difference of ~0.128 nm between the two lasers. To maintain this wavelength difference stable between two physically distinct lasers, well-engineered feedback loops must be utilized to control the physical parameters that determine their lasing wavelengths. In many instances, these parameters are the temperatures of the active junctions inside the master and slave lasers.

The self-injection approach of the present invention removes the disadvantage of using two distinct lasers in transmitter design. In particular, the disclosed approach taps part of the transmitter's optical output, and then takes advantage of external modulation to shift the frequency of the tapped signal. After filtering, this frequency-shifted signal is used to accomplish injection-locking of the DFB laser.

BRIEF DESCRIPTION OF THE INVENTION

In one aspect the present invention provides a distributed feedback laser system with self-injection locking. The laser system includes a distributed feedback laser having a laser output at a frequency $\omega_o$; a frequency shifting modulator coupled to the output of the distributed laser for generating two carrier-suppressed sidebands, the modulator being driven by a RF signal at a frequency $\omega_m$; a filter coupled to an output of the modulator to suppress or filter one of the two sidebands and to leave the other sideband essentially unattenuated; and an optical path coupling an output of the filter to the distributed feedback laser for injection locking.

In another aspect the present invention provides a method of enhancing the modulation bandwidth of a distributed feedback laser. The method includes tapping the output from the distributed feedback semiconductor laser; shifting the frequency of the tapped output; and feeding the frequency shifted tapped output back into an input of the distributed feedback semiconductor laser.

In yet another aspect the present invention provides a laser system with self-injection locking, the laser system including a laser having a laser output at a frequency $\omega_o$; an optical port providing a portion of said laser output at said port; a modulator coupled to the port, the modulator generating two sidebands, the modulator being driven by a RF signal at a frequency $\omega_m$; a filter coupled to an output of the modulator to filter out of one of the two carrier suppressed sidebands and leaving the other sideband essentially unattenuated; and an optical path coupling an output of the filter to the laser for injection locking.

In still yet another aspect the present invention provides a laser system with self-injection locking, the system including a laser having a laser output at a frequency $\omega_o$; an optical port providing a portion of the laser output at the port; a modulator, coupled to the port, driven by a RF signal at a frequency $\omega_m$ to generate two sidebands at $\omega_o \pm \omega_m$; a filter coupled to the modulator for suppressing at least one of the two sidebands of the signal $\omega_o \pm \omega_m$; and an optical path for coupling an output of the filter to the laser for injection locking the laser.

BRIEF DESCRIPTION OF THE FIGURES

FIG. 1 is a schematic diagram of a self-injection laser system;

FIG. 2 is schematic view of a Mach-Zehnder Modulator;

FIG. 3 is a graph depicting the effect of carrier-suppressed double sideband generation with the use of an electro-optic modulator; and FIG. 4 is a graph of the measured transmission spectrum of a Bragg Fiber Grating (BFG) filter.

DETAILED DESCRIPTION OF THE INVENTION

In accordance with the present invention, a self-injection system such as that shown in FIG. 1 is used to eliminate the need of using a bulky and expensive external laser. A distributed feedback (DFB) semiconductor laser is depicted by reference numeral 10. Other types of lasers than a DFB laser may be alternatively used provided that the laser is a single wavelength laser. For example, a DBR laser may be used in place of DFB laser 10. DFB lasers are preferred since they are readily available in the marketplace. A DFB laser typically has pigtails which can be conveniently used to connect it via optical isolators 12 to a fiber optical fused coupler 14 at the laser's output 10-2 and to a filter 18 at the laser's input 10-1. The optical isolators 12 are preferably used to eliminate undesirable reflective laser output from feeding back into the cavity of laser 10. Fiber optic cables 20 are preferably used to connect up these devices as shown in FIG. 1; however, those skilled in the art will appreciate that the laser light from laser 10 could travel in free space as opposed to inside the depicted fiber optic cables 20 in which case the light might, as needed, be directed using mirrored surfaces and split using a beam splitter. In the disclosed fiber optic cable embodiment one of the outputs from the fiber optic coupler 14 provides an output 22 from the self-injection laser system to a device or system which uses the laser light from the present invention.

A part of the DFB laser's output is tapped off by the fiber optic coupler 14 and fed via a port 14-2 to the input of a frequency-shifting modulator 16, such as, for example, an acousto-optic (AO) modulator or an electro-optic (EO) modulator. For offset frequencies that are less than 5 GHz, a SAW-based acousto-optic modulator 16 will suffice. If $\omega_o$ and $\omega_m$ are, respectively, the optical and RF modulation frequencies of the frequency-shifting modulator 16, one of the two sidebands ($\omega_o \pm \omega_m$) of the output from the AO modulator can be selected via the distinctive diffracted directions of its modulated beams. However, current AO modulators have bandwidth constraints of ~5 GHz. For offset frequencies that are above 5 GHz, an alternative approach is discussed below where a Mach-Zehnder modulator 16' is preferably substituted for a frequency-shifting acousto-optic (AO) or electro-optic (EO) modulator 16 in the self-injection laser system depicted by FIG. 1.

The amount of energy tapped off by the fiber optic coupler 14 is sufficient to meet the injection requirements of the particular laser 10 used in the system and also to account for loses in the optical components between the coupler 14 and the laser's injection end 10-1. For some lasers 10, the injection end 10-1 may be a common port with the laser's output 10-2 in which case a circulator might be used to separate the laser's output signal from the injection signal.

According to the Mach-Zehnder alternative embodiment, a Mach-Zehnder modulator 16' (see FIG. 2) is biased at a voltage that corresponds to $V_\pi$. When a RF signal ($V_{rf}=V_m \sin(\omega_m t)$) is applied to the modulator, two sidebands ($\omega_o \pm \omega_m$) are generated, typically with carrier suppression (see FIG. 3). In particular, the electric field at the output end 16'-1 of the modulator 16' is given by the following equations:

$$E_{out}(t) = \frac{E_{in}}{2} \cdot m \cdot \sin(\omega_m t) \cdot \sin(\omega_o t)$$

$$= \frac{E_{in}}{4} \cdot m \cdot (\cos(\omega_o - \omega_m)t + \cos(\omega_o + \omega_m)t)$$

Note, that the two optical sidebands are separated by $2\omega_m$. Furthermore, the offset of these sidebands from $\omega_o$ will be extremely stable. To be specific, the stability and accuracy of this frequency offset is determined, ultimately, by the phase-noise of the microwave synthesizer driving the photonic modulator 16'. For example, the phase noise of a 10 GHz synthesizer can be as low as −150 dBc/Hz at a frequency offset of 10 KHz from the carrier. If the desired offset frequency for injection locking is 15 GHz, the separation between the two optical sidebands is 30 GHz. One of the sidebands is suppressed or filtered out by filter 18 which filter is preferably a Bragg Fiber Grating (BFG) that is coupled to the modulator's output 16-2, 16'-2. The typical spectral stopband width of such a BFG filter is less than 0.1 nm, which corresponds to ~12.5 GHz in the frequency domain (for $\lambda$~1550 nm). FIG. 4 shows the transmission spectrum of a BFG filter fabricated at HRL Laboratories, LLC in Malibu, Calif. Bragg Fiber Grating filters are commercially available from other sources.

Filter 18 suppresses one of the two side bands of the modulator 16 (the filter can also be viewed as passing only one of the two side bands) and, in the event that the modulator 16 does not completely suppress its carrier, then the filter 18 also should further suppress or filter out the carrier as well. Filter 18 is a narrow band optical filter and a BFG filter is the preferred filter 18; however, other types of filters may be used. For example, a Fabry-Perot filter may be useful in certain embodiments as filter 18. The filter 18 should preferably be capable of suppressing the unwanted sideband to a sufficient degree that the unwanted sideband is not capable of also injection locking the laser 10. The specifics of filter 18 are determined by the injection ratio and the injection locking bandwidth of the laser 10 at a given injection ratio. For example, the unwanted sideband should be at least 15-20 db below the desired sideband and the desired sideband is preferably left substantially unattenuated or, if attenuated, preferably by not more than 5-10 db. Whether the wanted sideband is unsuppressed or is suppressed somewhat, the unwanted sideband should be suppressed by at least 15-20 db below the level of the desired sideband.

The injection locking property of DBF lasers tends to be asymmetric and, for this reason, filter 18 should preferably suppress the upper sideband which has the higher frequency components.

The indicated spectral width of 0.11 nm as shown on FIG. 4 was limited by the resolution of the particular measurement instrument utilized for testing. The actual spectral width is probably less than 0.1 nm. Therefore, one of the optical sidebands can be filtered with a BFG filter centered on it. The second sideband, separated by ~0.1 nm from the first one, will pass through the BFG filter without attenuation. In particular, this second sideband can be fed to the opposite end 10-1 of the DFB laser 10 to achieve the desired injection locking.

Having described this invention with respect to a preferred embodiment thereof, modification will now suggest itself to those skilled in the art. As such, the invention is not to be limited to the particular embodiments disclosed except as specifically required by the amended claims.

What is claimed is:

1. A laser system with self-injection locking, the laser system comprising:
   (a) a single frequency laser having a laser output for delivering laser light at a frequency $\omega_o$;
   (b) a modulator coupled to the output of the laser for generating two sidebands, the modulator being driven by a RF signal at a frequency $\omega_m$;
   (c) a filter coupled to an output of the modulator for suppressing or passing one of the two sidebands; and
   (d) an optical path coupling an output of the filter to the laser for injection locking.

2. The laser system with self-injection locking of claim 1 wherein the modulator is coupled to the laser via an optical coupler whereby the modulator receives a portion of the laser's output.

3. The laser system with self-injection locking of claim 2 wherein the modulator is a Mach-Zehnder modulator.

4. The laser system with self-injection locking of claim 2 wherein the modulator is an accousto-optic modulator.

5. The laser system with self-injection locking of claim 2 wherein the modulator is an electro-optic modulator.

6. The laser system with self-injection locking of claim 1 wherein the filter suppresses one of the two sidebands and leaves the other sideband substantially unattenuated.

7. The laser system with self-injection locking of claim 1 wherein the laser is a distributed feedback laser.

8. The laser system with self-injection locking of claim 1 wherein the modulator produces carrier suppressed sidebands.

9. The laser system with self-injection locking of claim 1 wherein the filter suppresses any carrier produced by the modulator.

10. The laser system with self-injection locking of claim 1 wherein the filter is a Bragg Fiber Grating.

11. A method of enhancing the modulation bandwidth of a distributed feedback laser, the distributed feedback laser having a operating frequency and having an output and an input, the method comprising the steps of:
    (a) tapping the output from the distributed feedback laser to thereby define a tapped optical signal;
    (b) shifting the frequency of the tapped optical signal to thereby define a shifted optical signal;
    (c) feeding the shifted optical signal back into the input of the distributed feedback laser.

12. The method of claim 11 wherein a Surface Acoustic Wave (SAW) device is used to shift the frequency of the tapped optical signal.

13. The method of claim 11 wherein an optical modulator device is used to shift the frequency of the tapped optical signal.

14. The method of claim 13 wherein the modulator is a Mach-Zehnder modulator.

15. The method of claim 13 wherein the shifting step includes suppressing unwanted frequencies.

16. The method of claim 15 wherein a Bragg Fiber Grating filter is used to suppress the unwanted frequencies further.

17. The method of claim 11 wherein the step of feeding the shifted optical signal back into the input includes suppressing unwanted frequencies.

18. The method of claim 17 wherein a Bragg Fiber Grating is used to suppress the unwanted frequencies.

19. A laser system with self-injection locking, the laser system including:
    (a) a laser having a laser output at a frequency $\omega_o$;
    (b) an optical port providing a portion of said laser output at said port;
    (c) a modulator coupled to the port, the modulator generating two sidebands, the modulator being driven by a RF signal at a frequency $\omega_m$;
    (d) a filter coupled to an output of the modulator for suppressing one of the two sidebands and leaving the other sideband essentially unattenuated; and
    (e) an optical path coupling an output of the filter to the laser for injection locking.

20. The laser system with self-injection locking of claim 19 wherein the modulator generates two carrier-suppressed sidebands.

21. The laser system with self-injection locking of claim 19 wherein the filter is a Bragg Fiber Grating.

22. The laser system with self-injection locking of claim 19 wherein the optical port is provided by an optical coupler connected to receive the laser output.

23. A laser system with self-injection locking, the system including a laser having a laser output at a frequency $\omega_o$; an optical port providing a portion of the laser output at the port; a modulator, coupled to the port, driven by a RF signal at a frequency $\omega_m$ to generate two sidebands at $\omega_o \pm \omega_m$; a filter coupled to the modulator for passing or suppressing one of the two sidebands of the signal $\omega_o \pm \omega_m$; and an optical path for coupling an output of the filter to the laser for injection locking the laser.

24. The laser system of claim 23 wherein the modulator produces the signal $\omega_o \pm \omega_m$ as a carrier suppressed signal.

25. The laser system of claim 23 wherein the modulator produces the signal $\omega_o \pm \omega_m$ as a signal with a carrier and said two side bands and wherein said filter suppresses said carrier and one of said two sidebands.

26. The laser system of claim 23 wherein the optical path includes at least one fiber optic cable.

27. The laser system of claim 23 wherein the filter is a Bragg Fiber Grating.

28. The laser system of claim 23 wherein the optical path includes a portion of free-space.

29. The laser system of claim 23 wherein the modulator is a surface acoustic wave (SAW) device.

30. A laser system with self-injection locking, the laser system comprising:
    (a) a single frequency laser having a laser output for delivering laser light at a frequency $\omega_o$;
    (b) an optical modulator coupled to the output of said laser for generating two optical sidebands, the modulator being driven by a RF signal at a frequency $\omega_m$;
    (c) an optical filter coupled to an output of the modulator for suppressing one of the two sidebands; and
    (e) an optical path coupling an output of the filter to the laser for injection locking.

31. The laser system with self-injection locking of claim 1 further including an optical isolator disposed at the laser output for inhibiting reflective laser output from feeding back into the laser.

32. The laser system with self-injection locking of claim 19 further including an optical isolator disposed at the laser output for inhibiting reflective laser output from feeding back into the laser.

33. The laser system with self-injection locking of claim 23 further including an optical isolator disposed at the laser output for inhibiting reflective laser output from feeding back into the laser.

34. The laser system with self-injection locking of claim 30 further including an optical isolator disposed at the laser output for inhibiting reflective laser output from feeding back into the laser.

* * * * *